(12) United States Patent
Mei et al.

(10) Patent No.: US 9,589,937 B2
(45) Date of Patent: Mar. 7, 2017

(54) SEMICONDUCTOR COOLING METHOD AND METHOD OF HEAT DISSIPATION

(71) Applicant: WUHAN XINXIN SEMICONDUCTOR MANUFACTURING CO., LTD., Hubei (CN)

(72) Inventors: Shaoning Mei, Hubei (CN); Jun Chen, Hubei (CN); Jifeng Zhu, Hubei (CN); Weihua Cheng, Hubei (CN)

(73) Assignee: WUHAN XINXIN SEMICONDUCTOR MANUFACTURING CO., LTD, Hubei (CN)

( * ) Notice: Subject to any disclaimer, the term of this patent is extended or adjusted under 35 U.S.C. 154(b) by 0 days.

(21) Appl. No.: 14/812,702

(22) Filed: Jul. 29, 2015

(65) Prior Publication Data
US 2016/0043058 A1 Feb. 11, 2016

(30) Foreign Application Priority Data

Aug. 8, 2014 (CN) .......................... 2014 1 0389774
Aug. 8, 2014 (CN) .......................... 2014 1 0391293

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/367* (2013.01); *H01L 23/3677* (2013.01);
(Continued)

(58) Field of Classification Search
CPC ... H01L 25/0657; H01L 25/50; H01L 23/367; H01L 23/3736; H01L 24/09;
(Continued)

(56) References Cited

U.S. PATENT DOCUMENTS

| 2002/0008444 A1* | 1/2002 | Sakata | B81B 7/0077 |
| | | | 310/328 |
| 2003/0100154 A1* | 5/2003 | Frisina | H01L 23/485 |
| | | | 438/197 |
| 2014/0154867 A1* | 6/2014 | Martinschitz | H01L 24/05 |
| | | | 438/455 |

FOREIGN PATENT DOCUMENTS

| CN | 102593087 | 7/2012 |
| CN | 202394961 | 8/2012 |
| CN | 103107128 | 5/2013 |

* cited by examiner

*Primary Examiner* — Alexander Oscar Williams
(74) *Attorney, Agent, or Firm* — Robert L. Wolter; Beusse, Wolter, Sanks & Maire PLLC

(57) ABSTRACT

The invention provides a semiconductor cooling method that comprises: providing two wafers which require to be treated by a mixed bonding process, wherein each of the wafers being provided with several metallic device structure layers therein. A heat dissipation layer is set in at least one of the wafers and arranged in the free area above at least one of the metallic device structure layers, and the heat dissipation layer connects to the adjacent metallic device structure layer and the invention provides a method of heat dissipation that comprises providing at least two wafers to be bonded; and arranging some conducting wires on a surface of wafers. In addition, the method includes the steps of performing a bonding process to form a device with bonded wafers, wherein one end of the conducting wires locates in the region where the wafers generate heat, and another end extends to an external of wafers.

9 Claims, 4 Drawing Sheets

(51) Int. Cl.
*H01L 23/367* (2006.01)
*H01L 23/373* (2006.01)
*H01L 25/00* (2006.01)

(52) U.S. Cl.
CPC .............. *H01L 24/09* (2013.01); *H01L 24/89* (2013.01); *H01L 25/50* (2013.01); *H01L 2224/08145* (2013.01); *H01L 2224/8019* (2013.01); *H01L 2225/06589* (2013.01); *H01L 2924/01013* (2013.01); *H01L 2924/01026* (2013.01); *H01L 2924/01029* (2013.01)

(58) Field of Classification Search
CPC ........... H01L 24/89; H01L 2225/06589; H01L 2924/01013; H01L 2924/01026; H01L 2924/01029; H01L 2224/08145; H01L 2224/8019; H01L 25/065; H01L 23/00; H01L 23/373; H01L 25/00
See application file for complete search history.

SEMICONDUCTOR COOLING METHOD AND METHOD OF HEAT DISSIPATION

CROSS-REFERENCE TO RELATED APPLICATIONS

The present application claims priority under the Paris Convention to Chinese application number CN 201410389774.8, filed on Aug. 8, 2014, and Chinese application number CN 201410391293.0, filed on Aug. 8, 2014, the disclosure of which is herewith incorporated by reference in their entirety.

BACKGROUND OF THE INVENTION

Field of the Invention

The invention relates to the field of semiconductor device manufacturing, more particularly, to a semiconductor cooling method and a method of heat dissipation.

Description of the Related Art

With the ever-increasing integration, the number of memory cells on a single chip increased dramatically, the increase of chip area, the growth of the connection between the cells both affects circuit speed and takes a lot of work area, seriously affecting the integrated circuit further enhance integration and operating speed. Thus new technology idea of three-dimensional integration generated. In the manufacture of advanced three-dimensional integrated circuits, typically requires mixed bonding process for two wafers containing metal and dielectric thin films, two wafers can make into one by mixed bonding process. The advantages of three-dimensional integration are: firstly, improve the packaging density. Multilayer device overlapping structure can exponentially increase chip integration. Secondly, increase the operating speed of the circuit. Overlapping structure shortens cell attachment, and makes parallel signal processing become possible, in order to achieve high speed operation of the circuit. Moreover, achieve new multifunctional devices and circuitry. For example, put the functional devices like photovoltaic devices and integrated circuits together to form a new functional system.

In the case of VLSI development increasingly approaching the physical limits, the three-dimensional integrated circuit having advantages in both physical size and costs is an effective way to prolong Moore's Law and solve the problem of advanced packaging. Wafer bonding technology is one of the key technologies of three-dimensional integrated circuit, especially mixed bonding technology enables interconnection of thousands of chips at the same time of two pieces of wafer bonding, which can greatly improve chip performance and save costs. Wafer bonding is a technology bonding two wafers or more than two pieces of wafers having different devices together, to make ions on wafer surface interact to produce covalent bond, and allow two wafers band together by atomic bonds rather than using bonding medium, this feature can meet the production requirements of microelectronic materials, optoelectronic materials and nanoscale MEMS components etc, and combine with different lattice, different types of single crystalline or polycrystalline material, and produce luminescent devices and photoelectric devices having special physical or chemical properties by different physical properties (such as thermal conductivity, mechanical strength), chemical properties (e.g. active energy) and electronic properties (e.g., electronic energy levels), etc. of the combined materials, or mobile communication devices for the development of low-voltage low-power, or low energy, high temperature resistant electronic devices and optoelectronic devices with emphasis on the use for space vehicle.

Meanwhile however, three-dimensional bond will generate a lot of heat, which will stack in the interior of the chip after bonding, so that make the stability of the device decline, thereby affecting the performance of the device. With the proposition of three-dimensional integration makes the device structure become more compact, then is faced with a problem: Since the three-dimensional integrated circuits is mostly multi-layer stack structure, the overall thermal power is increasing, but the surface area to volume ratio is falling, so the traditional flat cooling technology is no longer able to meet the cooling requirements of three-dimensional integrated circuit, and if long-term work under high temperature conditions may cause the device burned, so considering the heat dissipation is also a very essential question in bonded wafers.

China Patent (CN103107128A) discloses a metallic bonding method and bonding structure of three-dimensional chip architecture. Comprising chemical mechanical planarization process to top chip copper; depositing a silicon nitride layer on the surface after chemical mechanical planarization; etching the silicon nitride layer attached on top chip copper to form a groove, the bottom of the groove is the top chip copper; chemical mechanical planarization process to bottom chip copper; etching bottom silicon dioxide layer to make copper highlight; surface activation treatment after the etch of the bottom silicon dioxide layer; aligning and bonding copper of top chip and bottom chip; annealing the chip after bonding. However, this patent application does not cover how to solve the heat accumulation problem in existing bonding process.

China Patent (CN 102593087A) discloses a mixed bonding structure for three-dimensional integration, includes a first substrate; the first substrate has bonded interconnect metal electrically connected to the first substrate, the bonded interconnect metal forms invagination corresponding to the other end connected to the first substrate; the first substrate is covered with first dielectric adhesive layer around the bonded interconnect metal, the first dielectric adhesive layer surrounds the bonded interconnect metal and the height of the first dielectric adhesive layer is less than the edge height of the bonded interconnect metal. However, this patent application does not cover how to solve the heat accumulation problem in existing bonding process.

China Patent (Publication No.: CN 202394961U) discloses a semiconductor wafer having a cooling column, wherein: said semiconductor wafer comprises: a plurality of chips; an insulating connecting region which connects and supports said plurality of chips, wherein said plurality of chips equidistantly arrange with the form of an array in the insulating connection region; a re-wiring layer, formed on a first surface of the plurality of chips and the insulated connection region; a metal layer, formed on a second surface of the plurality of chips and the insulated connection region; and a plurality of cooling columns, formed on the metal layer corresponding to the position of each chip. This patent improves the effect of heat dissipation by setting the cooling columns, which however does not apply for wafer bonding process, since two wafers fitting together after bonding, heat-sinking capability of the two contact surfaces is limited. The patent may bring high difficulties in processing and high production costs and other misgivings in the application and actual production preparation, it has some limitations.

SUMMARY OF THE INVENTION

In view of the above problems, the invention provides a semiconductor cooling structure and method in a mixed bonding process.

The technology program used in the invention to solve the above problems is:

In an alternative embodiment, there is provided a semiconductor cooling method in a mixed bonding process, wherein the method comprises: providing two wafers which require to be treated by a mixed bonding process, each of the wafers being provided with several metallic device structure layers therein; a heat dissipation layer is set in at least one of the wafer, said heat dissipation layer is arranged in the free area above at least one of the metallic device structure layers, and the heat dissipation layer connects to an adjacent metallic device structure layer located under it wherein the material of each of said heat dissipation layers is good conductors of heat.

Said semiconductor cooling method in a mixed bonding process, wherein the material of said heat dissipation layers is metal.

Said semiconductor cooling method in a mixed bonding process, wherein said heat dissipation layer, through several holes, connects to the adjacent metallic device structure layer which is adjacent to and below the heat dissipation layer.

Said semiconductor cooling method in a mixed bonding process, wherein said several holes uniformly distribute in a same plane.

Said semiconductor cooling method in a mixed bonding process, wherein said heat dissipation layer is composed of a plurality of parallel distributed metal wires in a same plane, each two of said metal wires which are adjacent to each other are connected at their respective ends.

Said semiconductor cooling method in a mixed bonding process, wherein widths of each of said metal wires are equal.

Said semiconductor cooling method in a mixed bonding process, wherein said heat dissipation layer are arranged at a bonding interface of two wafers.

Said semiconductor cooling method in a mixed bonding process, wherein said metal includes any one or combinations of aluminum, iron and copper.

In another alternative embodiment, there is provided a semiconductor cooling structure in a mixed bonding process, wherein said structure comprises: several metallic device structure layers arranged on two wafers for bonded; and at least one heat dissipation layer, each of said heat dissipation layers being arranged in the free area above one of the metallic device structure layers, and each of said heat dissipation layers, through several holes, connects to the adjacent metallic device structure layer which is adjacent to and below the heat dissipation layer; wherein material of each of said heat dissipation layer is good conductors of heat.

Said semiconductor cooling structure in a mixed bonding process, wherein the material of said heat dissipation layers is metal.

Said semiconductor cooling structure in a mixed bonding process, wherein said metal includes any one or combinations of aluminum, iron, copper, tungsten, tantalum, titanium, gold and silver.

Said semiconductor cooling structure in mixed bonding process, wherein said holes are filled with same metal as the said heat dissipation layer.

Said semiconductor cooling structure in a mixed bonding process, wherein said heat dissipation layer is composed of a plurality of parallel distributed metal wires in a same plane, and each two of said metal wires which are adjacent to each other are connected at their both ends.

Said semiconductor cooling structure in a mixed bonding process, wherein widths of each of said metal wires are equal.

According to the difficulty of heat dissipation in three-dimensional integrated circuit, the invention provides a method for improving effects of heat dissipation of a bonded wafer, specifically as follows:

In another alternative embodiment, a method for improving effects of heat dissipation of a bonded wafer, wherein the method comprises: providing at least two waters to be bonded; arranging some conducting wires on a surface of said wafers; performing a bonding process to form a device with bonded wafers; wherein one end of the conducting wires locates in the region where the wafers generate heat, another end extends to an external of said wafers in order to export the heat generated by said device through said conducting wires.

Said method for improving the effect of heat dissipation of a bonded wafer, wherein device structures generating heats during working are arranged in said region, said conducting wires are arranged adjacent to or contacting with said device structure.

Said method for improving the effect of heat dissipation of a bonded wafer, wherein said region comprises a circuit area.

Said method for improving the effect of heat dissipation of a bonded wafer, wherein said conducting wires surround the circuit area which is inside said wafers.

Said method for improving the effect of heat dissipation of a bonded wafer, wherein said device structures contacted with said conducting wires connect to ground through the conducting wires, and said conducting wires do not affect the normal operation of said device structures.

Said method for improving the effect of heat dissipation of a bonded wafer, an end of said conducting wires which extends to the external of said wafers is connected to a radiator.

Said method for improving the effect of heat dissipation of a bonded wafer, a material of said conducting wires is metal; wherein the material of said conducting wires is any one of aluminum, copper, silver, tungsten, stannum, gold and tantalum or metal alloy material comprising one or more of above.

Said method for improving the effect of heat dissipation of a bonded wafer, wherein one end of each of said conducting wires is a forked metal wire.

Said method for improving the effect of heat dissipation of a bonded wafer, wherein said method is applied to semiconductor mixed bonding technology or three-dimensional stacking technology of integrated circuits.

Said method for improving the effect of heat dissipation of a bonded wafer, wherein, each of said wafers is provided with a number of bonding pads which is configured to position each of said wafers in the bonding process.

Above technical scheme has the following advantages or beneficial effects: the invention can make heat generated during the bonding process transfer and distribute evenly by setting the semiconductor structure layer in the wafers to be bonded, which to some extent blocks the transfer of heat radiation, thus avoiding heat accumulation in the chip which results the problems of reduction of the device; on the other hand, according to the invention, the semiconductor structure also can play the role of shielding electromagnetic radiation.

The invention uses additional conducting wires achieving better heat dissipation effect and extending the life of the device under the premise that does not affect the bonding quality through adding conducting wires on the surface of the wafers to be bonded; and the conducting wires added in wafers can also be used as public ground wires.

BRIEF DESCRIPTIONS OF THE DRAWINGS

Refer to the accompanying drawings to more fully describing the embodiment of the invention. However, the accompanying drawings only use for description and elaboration and do not constitute a limitation to the scope of the invention.

DETAILED DESCRIPTIONS

Figure 1:
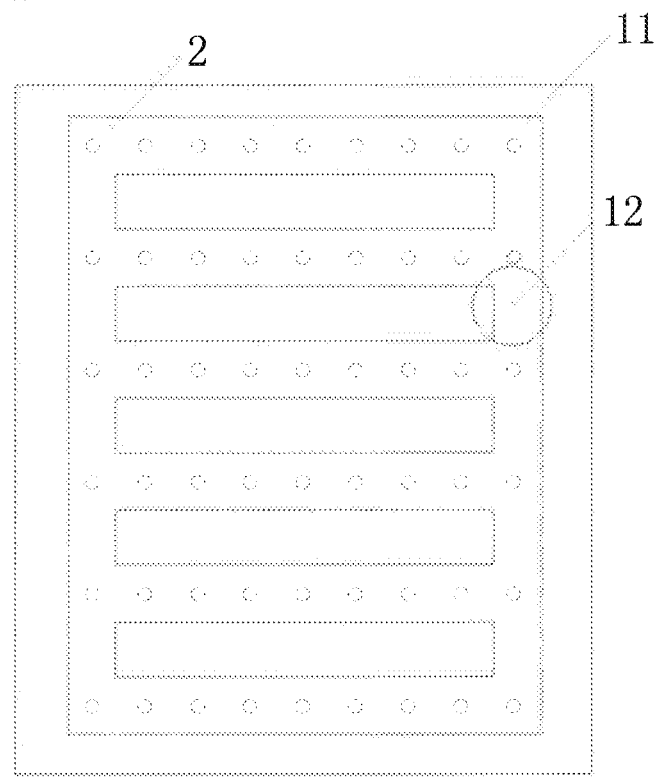
FIG. 1 is a top view of structural representation of heat dissipation layer being arranged in the wafers to be bonded in an alternative embodiment of the invention.
Figure 2:
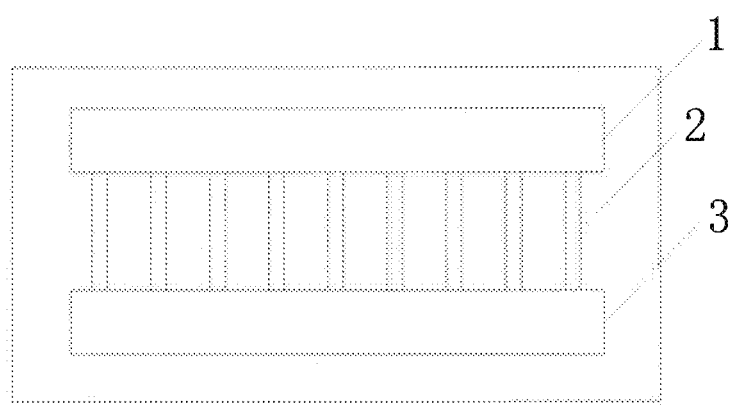
FIG. 2 is a profile structure diagram of heat dissipation layer set in the wafers to be bonded based on the embodiment of FIG. 1 in the invention.

In an embodiment of FIGS. 1 to 2, the invention provides a semiconductor cooling structure and method in a mixed bonding process.

The method of the invention includes: Firstly, providing two wafers which require to be treated by a mixed bonding process, each of the wafers being provided with several metallic device structure layers therein. Wherein, the several metallic device structure layers in a same wafer overlapping sequence in vertical direction. In an alternative but non-limiting embodiment, the so-called vertical direction for example may be a direction perpendicular to the plane where the wafers in.

Then, a heat dissipation layer is arranged in the free area above at least one of the metallic device structure layers in at least one of the wafers, that is to say, a heat dissipation layer is arranged on at least one of the wafers, said heat dissipation layer is arranged in the free area above at least one of the metallic device structure layers, and the heat dissipation layer connects to the adjacent metallic device structure layer which is adjacent to and below the heat dissipation layer. In an alternative but non-limiting embodiment, the so-called free area may include circuit vacancy area prepared of no effective integrated circuits or components in wafers.

When the two wafers in the mixed bonding process, heat is generated inside the wafers, the heat is typically not evenly distributed in metallic device structure layers, the connection of above heat dissipation layer and the metallic device structure layers can transfer the heat in the metallic device structure layers to the heat dissipation layer, the evenly transfer of the heat through the heat dissipation layer makes the heat distribute evenly in the internal of two bonded wafers, and meanwhile diffuse faster.

In the above method, material of the heat dissipation layers is good conductor of heat, the use of thermal conductive material is favorable to the diffusion and conduction of heat, preferably using the metal having good heat-conducting property as the material of heat dissipation layer in the good conductor, the metal can use any one or combinations of aluminum, iron and copper.

In an embodiment of the method of the invention, the above heat dissipation layer, through several holes, connects to the adjacent metallic device structure layer which is adjacent to and below the heat dissipation layer, and the holes uniformly distribute in a same plane; the above heat dissipation layer is composed of a plurality of parallel distributed metal wires in a same plane, each two of said metal wires which are adjacent to each other are connected at their respective ends, and widths of each of the metal wires are equal. Preferably the interval between every two adjacent wires is of the same distance. In this embodiment, the heat dissipation layers are arranged at a bonding interface of the wafers in order to make thermal cooling effect more apparent. It should be noted that the heat dissipation layer is not limited to arranged in the bonding interface of the wafers, but only to ensure that the heat dissipation layer is connected to any one or more layers of metallic device structure layers in the wafers and the position of which can flexibly change according to the need of practical process.

The following will combine with the accompanying drawings to detail the above embodiments.

FIG. 1 is a top view of structural representation of heat dissipation layer being arranged in the wafers to be bonded in an alternative embodiment of the invention, FIG. 2 is a profile structure diagram of heat dissipation layer being arranged in the wafers to be bonded based on the embodiment of FIG. 1 in the invention. As shown in FIG. 1-2, in the embodiment, firstly, providing two wafers which require to be treated by a mixed bonding process, each of the wafers bottom-up include several metallic device structure layers.

Then, a heat dissipation layer 1 is arranged in the free area above at least one of the metallic device structure layers 3 in each of the wafers, as an option but not a must, the so-called free area includes circuit vacancy area prepared of no effective integrated circuits or components in wafers. In the embodiment, the heat dissipation layer 1 is arranged at the interface of wafers where need to be bonded with other wafers, e.g., the heat dissipation layer 1 is arranged in the free area above the topmost metallic device structure layer 3 in the wafers, in the embodiment, the heat dissipation layer 1 is composed of a plurality of parallel distributed metal wires 11, and widths of the metal wires 11 are equal and equally spaced, wherein in some alternative embodiments, two adjacent metal wires 11 may connect at their respective ends 12; Each of the metal wires 11 connect to the nether adjacent metallic device structure layer 3 through some holes 2 set in its lower part. The above holes 2 uniformly distribute in a same plane, and the interval between two adjacent holes 2 is equal, that is to say all holes 2 are equally spaced. In some alternative embodiments, the holes 2 can fill with metal material.

By the method of above embodiments, arranging heat dissipation layer 1 in wafers makes the wafers disperse the internal heat after bonding, and dissipate heat more evenly. Due to the adopting of uniform distribution of heat dissipation layer 1 and holes 2, the heat distribution is more uniform. In addition, arranging the heat dissipation layer 1 in the bonding interface of the wafers will be further benefit for heat dissipation.

The invention also provides a semiconductor cooling structure in a mixed bonding process.

The structure is firmed through the above heat dissipation method, as shown in FIG. 1 and 2, the structure comprises:

Several metallic device structure layers arranged on two wafers for bonded; and at least one heat dissipation layer 1, each of said heat dissipation layer is arranged in the free area above one of the metallic device structure layers, and each of said heat dissipation layers, through a number of holes, connects to the adjacent metallic device structure layer which is adjacent to and below the heat dissipation layer; the materials of each of said heat dissipation layer are good conductors of heat. Further, the material of the heat dissipation layer may be metal, preferably may be one or more of aluminum, iron, copper, tungsten, tantalum, titanium, gold, silver and other commonly used semiconductor metals.

In a preferred embodiment, the above heat dissipation layer 1 is set at the bonding interface of wafers, that is to say the heat dissipation layer 1 is arranged in the free area above the topmost metallic device structure layer 3 in several metallic device structure layers, and the heat dissipation layer, through a number of holes 2, connects to the adjacent metallic device structure layer which is adjacent to and below the heat dissipation layer.

In the above structure, the heat dissipation layer 1 is composed of a plurality of parallel distributed metal wires 11 in a same plane, every two metal wires 11 which are adjacent to each other are connected at both ends 21.

Preferably, in the above plurality of metal wires 11, widths of each metal wire 11 are equal.

Arranging heat dissipation layer 1 in wafers to be bonded makes the wafers won't produce local heat accumulation in internal after bonding, but uniformly disperse the heat through the equally distributed metal wires and holes, which makes the thermal distribution of the device more uniform, and avoid the yield and stability problems due to heat concentrated gather of wafers.

Figure 3:
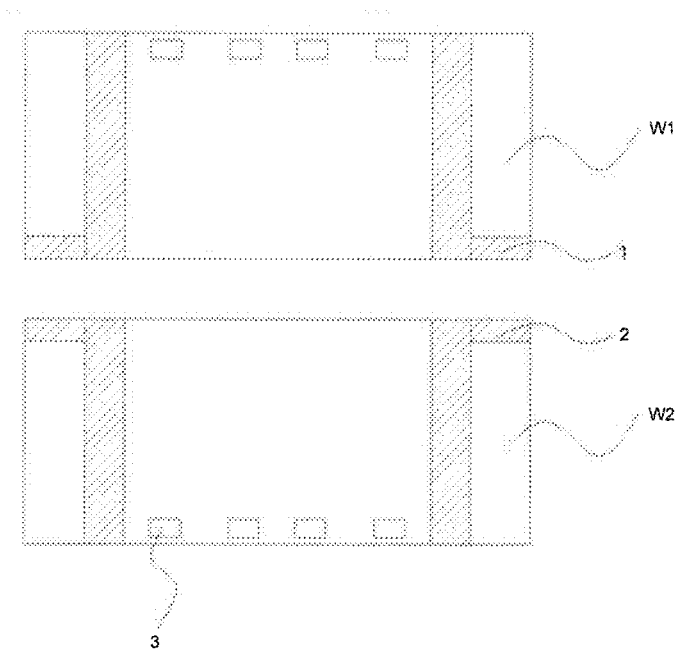
FIG. 3 is a schematic diagram of two wafers provided by another alternative embodiment of the invention.
Figure 4:
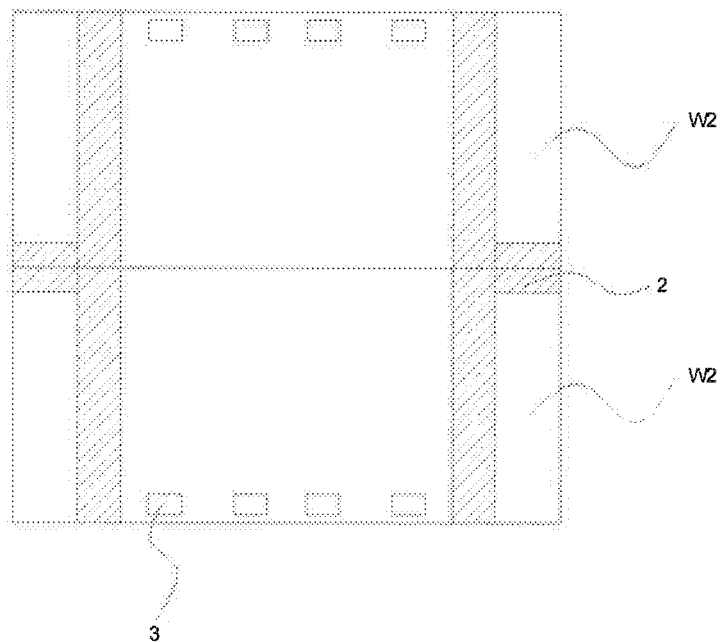
FIG. 4 is a schematic diagram of completing the bonding process based on the embodiment of FIG. 3.

In addition, in the embodiment of FIGS. 3 and 4, the invention also provides a method for improving effects of heat dissipation of wafer, for example can be used in semiconductor mixed bonding technology or three-dimensional stacking technology of integrated circuits. Specifically the method comprises: firstly providing at least two wafers to be bonded W1 and W2, every wafer has integrated circuit area for the device area), and each of the wafers are provided with bonding pads 30 for positioning in bonding process, so that the two wafers can be bonded together in the correct position.

Wherein the surface of one of the wafers W1 or W2 or each of the wafers W1 and W2 is provided with conducting wires 20, materials of the conducting wires 20 include but not limit to metal, preferably, the material of the conducting wires 20 is one of the aluminum, copper, silver, tungsten, stannum, gold and tantalum or metal alloy material containing one or more of the above. One end of the conducting wires 20 locates in the region where the wafers W1 and/or W2 generate heat, another end extends to external of the bonded wafers W1 and/or W2 in order to export the heat generated by the device with bonded wafers through the conducting wires. The external here for example may include some non-heat generation areas away from the heat generated areas on the surface of the wafers, Wherein, device structures generating heats during working are arranged in said region, and the conducting wires 20 are arranged adjacent to or contacting with the device structure, the heat generated areas include circuit areas (or the device areas) within the wafer. Preferably, one end of the conducting wires 20 is forked, further preferably, the conducting wires 20 surround the circuit area which is inside the wafers W1 and/or W2.

After completion of the wafer bonding process, the two wafers W1 and W2 together constitute the three-dimensional wafer bonding device, which greatly improves the integration of the chips, but also causes some challenges to the cooling capacity of the device after bonding. The invention sets conducting wires on the surface of the wafers, one end of which connects to the device inside of the wafers, and the other end is connected to a radiator or uses as a radiator, when the device works, the internal circuitry region or device area generates heat, if not timely discharges the heat, the device performance may be affected, even the device may be burned; in the invention, conducting wires 20 are used fix heat dissipation to avoid the influence of device performance and the overburning of the device due to work under high temperature conditions, so that to extend the life of the device.

While in the invention, the conducting wires 20 have a variety of distribution methods, and thus can lead to better cooling effect, here are a few examples for further elaboration. It should be noted that, an end of the conducting wires 20 is connected to the circuit area of the wafers or is located near the circuit area, while the other end is located outside the wafers, the conducting wires outside the wafers can be used directly as a heat dissipation for dissipating the heat; at the same time, in order to achieve better cooling effect, the end of the conducting wires outside the wafers can connect to a radiator or a heat dissipation, so that to discharge the heat inside the device using the heat dissipation. The specific connections of both ends will not repeat here, what described emphatically is the layout of the conducting wires 20.

Figures 5A, 5B:
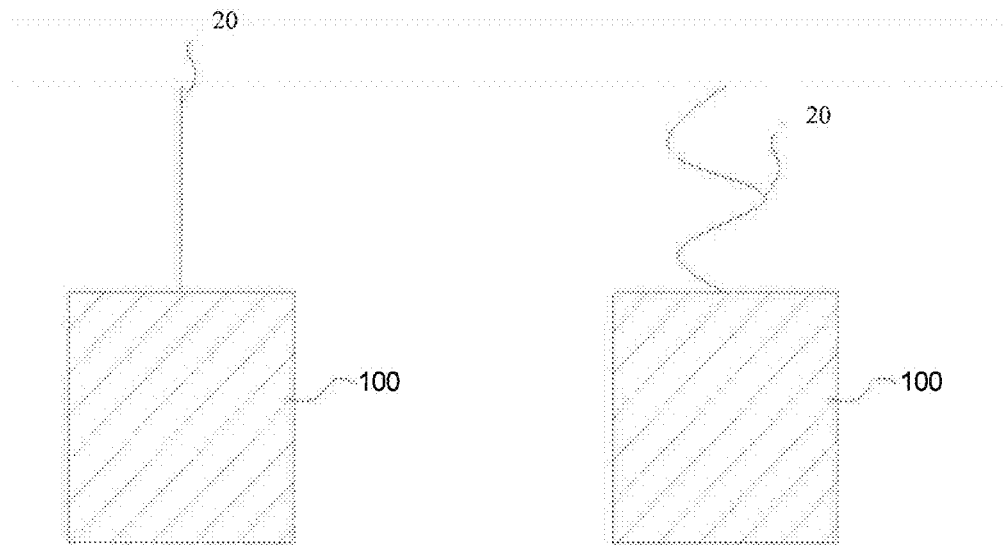
FIGS. 5a to 5e are schematic diagrams of a variety of embodiments of conducting wires layout of the invention.
Figures 5C, 5D:
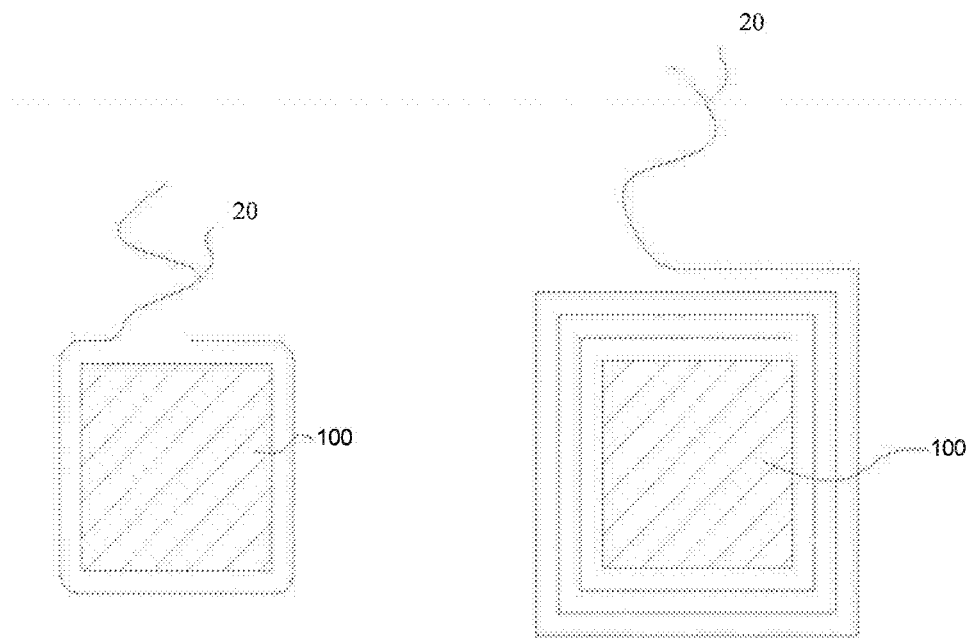
Figure 5E:
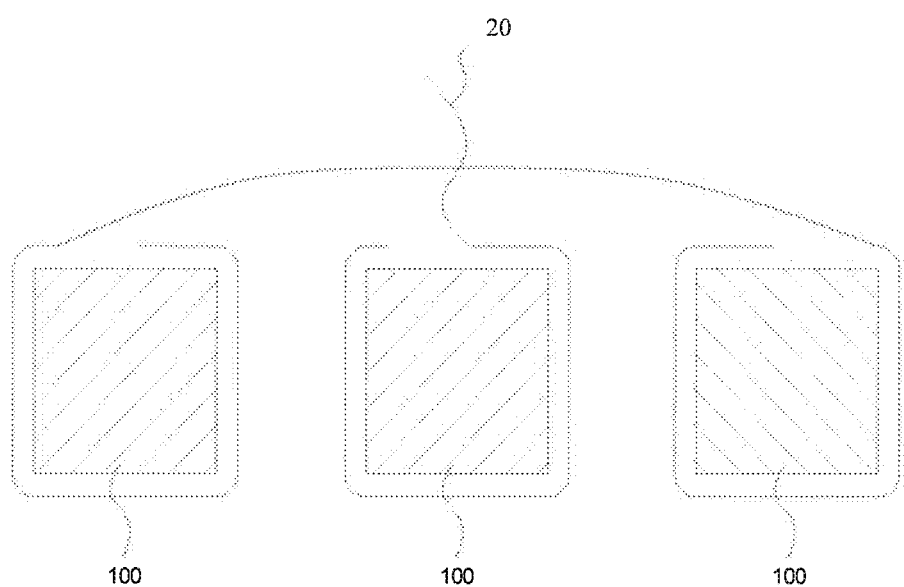

In an alternative embodiment, the conducting wires 20 linearly distribute and one end of which directly connects to the surface of wafers or inner circuit area 100, as shown in FIG. 5a. In an embodiment, the conducting wires 20 curved distribute, thanks to the curving conducting wires 20, the length of the conducting wires 20 can be increased in the available space, and thus bring better thermal conductivity and heat dissipation effect, as shown in FIG. 5b. In an embodiment, the conducting wires 20 may surround the circuit region 100, which increases the length and the coverage area 20 of the conducting wires, and achieves a wider range of heat dissipation, while the heat dissipation is also more uniform, as shown in FIG. 5c. While the embodiment may further extend that the conducting wires 20 spirally surround circuit area 100 to further extend the length and expand the cooling area of conducting wires 20, and thus leads to better heat dissipation effect, as shown in FIG. 5d. In an embodiment, one end of the conducting wires 20 inside the bonded wafers may be bifurcate structure, as shown in FIG. 5e, a plurality of circuit regions 100 may share a conducting wire 20, in order to achieve a plurality of circuit sections 100 share a cooling end to reduce production costs through the share of cooling end at the same time of guarantee the cooling effect.

Since the invention employs the above technical solutions, providing the conducting wires on the wafers, one end of the conducting wires connecting to circuit area of the wafers or near the circuit area, and the other end using as a radiator or connecting to a heat dissipation, which can discharge the heat generated by the device at work with the conducting wires, and it will help to extend the life of the device; while avoid the damage due to the device working long hours under high temperature conditions, thereby ensuring performance and stability of the device.

The above is only the better embodiments of the invention, but not thus limiting embodiments and scope of protection of the invention, the skilled in the field should be able to recognize the programs from equivalent replacements and obvious changes using the specification and graphic content of the invention are all be included in the scope of protection of the invention.

What is claimed is:

1. A semiconductor cooling method in a mixed bonding process, comprising:
   providing two wafers which require to be treated by a mixed bonding process, each of the wafers being provided with several metallic device structure layers therein;
   a heat dissipation layer is arranged in at least one of the wafers, said heat dissipation layer is arranged in the free area above at least one of the metallic device structure layers, and the heat dissipation layer connects to the adjacent metallic device structure layer which is adjacent to and below the heat dissipation layer;
   wherein, material of each of said heat dissipation layers is a good conductor of heat; said heat dissipation layer, through a plurality of holes, connects to the adjacent metallic device structure layer which is adjacent to and below the heat dissipation layer; said plurality of holes uniformly distribute in a same plane; said heat dissipation layer is composed of a plurality of parallel distributed metal wires in a same plane; and an interval between every two adjacent wires is of the same distance.

2. The semiconductor cooling method in a mixed bonding process as claimed in claim 1, wherein the material of said heat dissipation layers is metal.

3. The semiconductor cooling method in a mixed bonding process as claimed in claim 1, wherein said heat dissipation layer are arranged at a bonding interface of two wafers.

4. A method for improving effects of heat dissipation of a bonded wafer, comprising:
   providing at least two wafers to be bonded;
   arranging plurality of conducting wires on a surface of said wafers;
   performing a bonding process to form a device with bonded wafers;
   wherein one end of the conducting wires locates in a region where the wafers generate heat, another end extends to an external of said wafers in order to export the heat generated by said device through said conducting wires; wherein device structures generating heat during the bonding process are arranged in said region, said conducting wires are arranged adjacent to or contacting with said device structure; said region comprises a circuit area; wherein said conducting wires spirally surround the circuit area which is inside said wafers.

5. The method for improving the effect of heat dissipation of a bonded wafer as claimed in claim 4, wherein said device structures contacted with said conducting wires connect to ground through the conducting wires, and said conducting wires do not affect the normal operation of said device structures.

6. The method for improving the effect of heat dissipation of a bonded wafer as claimed in claim 4, wherein an end of said conducting wires which extends to the external of said wafers is connected to a radiator.

7. The method for improving the effect of heat dissipation of a bonded wafer as claimed in claim 4, wherein one end of each of said conducting wires is a forked metal wire.

8. The method for improving the effect of heat dissipation of a bonded wafer as claimed in claim 4, wherein said method is applied to semiconductor mixed bonding technology or three-dimensional stacking technology of integrated circuits.

9. The method for improving the effect of heat dissipation of a bonded wafer as claimed in claim 4, wherein each of said wafers is provided with a number of bonding pads which is configured to position each of said wafers in the bonding process.

* * * * *